United States Patent [19]

Ouellet

[11] Patent Number: 5,270,267
[45] Date of Patent: Dec. 14, 1993

[54] CURING AND PASSIVATION OF SPIN ON GLASSES BY A PLASMA PROCESS WHEREIN AN EXTERNAL POLARIZATION FIELD IS APPLIED TO THE SUBSTRATE

[75] Inventor: Luc M. Ouellet, Granby, Canada

[73] Assignee: Mitel Corporation, Canada

[21] Appl. No.: 794,789

[22] Filed: Nov. 19, 1991

Related U.S. Application Data

[63] Continuation of Ser. No. 359,626, May 31, 1989, abandoned.

[51] Int. Cl.$^5$ .................. H01L 21/00; H01L 21/02; H01L 21/469
[52] U.S. Cl. ................................ 437/231; 437/235; 437/238; 437/239; 427/488; 427/535
[58] Field of Search .............. 437/225, 228, 231, 235, 437/238, 239; 427/38, 39, 387, 397.7; 357/52

[56] References Cited

U.S. PATENT DOCUMENTS

| 4,704,299 | 11/1987 | Wielonski et al. | 427/38 |
| 4,723,978 | 2/1988 | Clodgo et al. | 437/231 |
| 4,885,262 | 12/1989 | Ting et al. | 437/231 |
| 4,983,546 | 1/1991 | Hyun et al. | 437/231 |

FOREIGN PATENT DOCUMENTS

| 0327412 | 8/1989 | European Pat. Off. | |
| 0154643 | 7/1987 | Japan. | |
| 0274078 | 11/1987 | Japan. | |
| 0140539 | 6/1988 | Japan. | |
| 9001383 | 1/1992 | Netherlands | 437/281 |

OTHER PUBLICATIONS

Butherus, O$_2$ plasma-converted Spin-on-Glass for Planarization, J. Vac. Sci. Technol. B3(5), Sep. 1985, pp. 1352-1356.

Schiltz, Advantages of Using Spin-On-Glass Layer in Interconnection Dielectric Planarization, Microelectronic Engineering, 1986, pp. 413-421.

Pliskin, Comparison of Properties of Dielectric Films Deposited by Various Methods, J. Vac. Sci. Technol., vol. 14, No. 5, Sep. 1977, pp. 1065-1081.

Takamatsu, Evaluations of Plasma Silicon-Oxide Film (P-SiO) by Infrared Absorption, J. Electrochem. Soc.: Sol-State Sci. & Tech., Feb. 1986, pp. 443-445.

*Primary Examiner*—Tom Thomas
*Assistant Examiner*—B. Everhart
*Attorney, Agent, or Firm*—Laff, Whitesel, Conte & Saret

[57] ABSTRACT

A method of producing insulating layers over a semiconductor substrate comprising spinning a film of spin-on-glass (SOG) over a semiconductor substrate, precuring the film of SOG at an elevated temperature sufficient to remove the bulk of solvent and curing the film of SOG in a plasma in a plasma reactor of a type exhibiting a self-biased $R_F$ discharge adjacent the SOG for a period of time sufficient to exclude the bulk of SiOH, organic volatiles and H$_2$O from the layer.

27 Claims, No Drawings

CURING AND PASSIVATION OF SPIN ON GLASSES BY A PLASMA PROCESS WHEREIN AN EXTERNAL POLARIZATION FIELD IS APPLIED TO THE SUBSTRATE

This application is a continuation of application Ser. No. 07/359,626, filed May 31, 1989 now abandoned.

This invention relates to passivating or dielectric layers formed of spin-on-glass that are useful in semiconductor integrated circuits, liquid crystal, electrochromic or electroluminescent displays, as anti-reflective coatings, corrosion or chemical protective coatings, a method for producing such layers, and products incorporating one or more of such layers.

Spin-on glasses (SOG) have been described as being able to be used for the purpose of planarizing integrated circuits. Because of their inherent filling and planarizing properties, their use is particularly attractive as the size of semiconductor integrated circuits decreases, and when multiple level metallization is needed.

Unfortunately, cured SOG has been found to be unstable in moist air and water, tending to absorb water and form silanol groups, SiOH.

SOG and its method of curing have been described in the article by A. Schiltz entitled ADVANTAGES OF USING SPIN-ON-GLASS LAYER IN INTERCONNECTION DIELECTRIC PLANARIZATION, published in "Microelectronic Engineering" 5 (1986) pp. 413–421 by Elsevier Science Publishers BV (North Holland), and the article $O_2$ PLASMA-CONVERTED SPIN-ON-GLASS FOR PLANARIZATION by A. D. Butherus et al, September/October 1985, J. Vac. Sci. Technol. B3(5) pp. 1352–1356.

In the article COMPARISON OF PROPERTIES OF DIELECTRIC FILMS DEPOSITED BY VARIOUS METHODS by W. A. Pliskin, J. Vac. Sci. Technol. Vol. 14 No. 5, September/October 1977, pp. 1065–1081, the SiOH and $H_2O$ content in various dielectric thin films is described. In the article EVALUATIONS OF PLASMA SILICON-OXIDE FILM (P-SiO) BY INFRARED ABSORPTION by A. Takamatsu et al, J. Electro. Chem. Soc.: Solid-State Science & Technology, February 1986, pp. 443–445, the relationship between the presence of SiOH and failure of semiconductor devices are described.

It is clear that the known process for producing SOG produces SiOH, organic volatiles, and $H_2O$ including solvents, alcohols, large organometallic molecules and large organic molecules, which is associated with corrosion of metallization lines in contact with SOG, outgassing during metallization resulting in via-poisoning, poor adhesion due to outgassing and other $H_2O$, organic volatiles, and SiOH effects, cracking, peeling and flaking of films deposited over SOG due to outgassing related pressure buildup, low breakdown voltage of dielectric combinations with SOG, lossy dielectric combinations with SOG, low density dielectrics due to the presence of $H_2O$ and SiOH in SOG, reduced meantime between failure in accelerated life test stressing due to the presence of $H_2O$, organic volatiles, and SiOH, the requirement for SOG to be subjected to an etch back process, and the result that SOG cannot be used as the constituent of a required high quality dielectric.

After SOG was deposited in order to planarize the surface of a semiconductor, an etch back technique was required to be used in multilevel planarization to remove all of the SOG over the lines of a first level of metallization so as to leave only a minimum amount of SOG in the recesses. This resulted in poor process flexibility, poor process compatibility, the requirement to use expensive etch back equipment, and the necessity of tight specifications for depositions and etch back.

Contact with water was prohibited. Contact with moist air was required to be minimized by using in-situ curing and/or long outgassing cycles after air contact. This has been found to be not really adequate to rid the layer of SiOH, organic volatiles, and $H_2O$ since some remains even after very long outgassing cycles.

The remanent SiOH, organic volatiles, and $H_2O$ produced via poisoning. This limited the technology to large metal via spacings, and thus the use of SOG adjacent vias was not really practical for small geometry. Very long back sputter and outgassing steps were needed to outgas the absorbed water.

Indeed, for applications where device reliability is particularly important, such as for military applications, the use of SOG technology for semiconductor integrated circuit applications has been prohibited.

In order to avoid contact of SOG and metal at places other than the vias for multilevel metallization, the SOG layer was required to be put into a sandwich between two dielectric layers to form a completed dielectric combination of a desired thickness.

The quantity of SOG used was required to be minimized, and the aspect ratios was adjusted to obtain everywhere a good combination of dielectric and SOG.

SOG was normally cured thermally in nitrogen, argon, oxygen, water or forming gas at temperatures of between 300° C. and 450° C. for durations between 30 minutes and 2 hours. Wafer storage, loading and unloading for process was required to be done in a dry ambient environment.

In the article of Schiltz and Butherus, attempts were described to cure organic SOG by means of an oxygen plasma in a barrel reactor. Unfortunately, as may be seen in the infrared obsorption spectrum in FIG. 3 of Butherus, and as described on page 1354, the five last lines of the left-hand column, and as shown in FIG. 6 of Schiltz, significant amounts of SiOH and $H_2O$ are obtained using that process as a result of the oxidation of the methyl-$CH_3$ bonds by the active oxygen atoms/molecules. In addition, densification of the SOG occurs due to the production of volatile carbon oxide compounds, which were to be evaporated. However water was also formed as a byproduct, which was found to be retained in the SOG.

In accordance with the present invention, an SOG film is produced which is substantially SiOH, organic volatiles and $H_2O$ free after the treatment. The film has been found to be very stable in moist air and/or water after the treatment. Thus subsequent processing is simplified.

Because of the stability and no apparent formation of SiOH, organic volatiles and $H_2O$ once the films have been plasma cured, a dry photoresist strip in $O_2$ plasma is feasible. Via poisoning by SiOH, organic volatiles and $H_2O$ is eliminated where the SOG formed in accordance with the present invention contacts vias.

SOG films formed by the process of this invention can be stored in moist air for reasonably long periods of time without any appreciable effect-on the film after treatment. This is in contrast with tight control required for SOG formed in accordance with the prior art.

It has been found that SOG cured in a plasma which causes an electric field in the SOG film, which can be caused by a DC self-bias in the RF discharge which develops near the surface of the wafer to be treated, will contain substantially no SiOH, organic volatiles and $H_2O$, and indeed becomes cured throughout the SOG layer. Further, SOG layers exposed to $H_2O$ prior to curing in this manner, and thus which have absorbed some $H_2O$, have been found to be substantially devoid of $H_2O$ following a subsequent cure using the process of the present invention. The electrical effects which cause an electric field within the SOG are of prime importance in the SOG curing and passivation treatment.

It has been found that the barrel plasma reactor used in the prior art does not cause the sufficient required electric field within the SOG being treated. In contrast, a parallel plate reactor does cause the required field to be produced (assuming that the plasma is most positive and the substrate carrying the SOG is in electrical contact with the electrode, as is usual in plasma treatment).

Indeed, the electric field can be enhanced by applying an external AC or DC polarization field to the SOG (including the substrate) to increase the internal electric field thereof.

It has been found that the nature of the gas used is not essential to the invention, and many gases could be used with good results. While an oxygen plasma gas could be used, it is not the preferred gas, for reasons to be described with reference to the given examples.

Large satisfactory SOG thicknesses have been obtained without cracking or adhesion loss, permitting the cured SOG to be used as a dielectric layer itself (i.e. in contact with a semiconductor surface and/or an overlying metal layer), and not solely as a planarizing medium. The dielectric properties of the SOG treated in accordance with the present invention are better than SOG layers described in the prior art, because of water, organic volatiles and SiOH reduction. In addition corrosion of metal lines and other films in contact with the SOG formed in accordance with the present invention because of the water, organic volatiles and SiOH is substantially reduced or eliminated.

Via poisoning is reduced because of water, organic volatiles and SiOH reduction, and the adhesion of films over SOG is improved due to improved outgassing behaviour due to the water, organic volatiles and SiOH reduction or elimination. Film cracking over SOG produced in accordance with the present invention is minimized or eliminated because of improved outgassing behaviour due to the water, organic volatiles and SiOH reduction. Device reliability is also improved for the same reason.

The plasma treatment described herein is effective for various types of SOG, such as siloxanes, silicates, doped silicates and other spin-on materials.

An embodiment of the present invention is a method for producing insulating layers over a substrate comprising spinning a film of spin-on glass (SOG) over a silicon wafer, precuring the film of SOG at an elevated temperature sufficient to remove the bulk of the solvent of the SOG, and curing the film of SOG in a plasma in a reactor of a type exhibiting a self-biased RF discharge adjacent the SOG for a period of time sufficient to exclude the bulk of SiOH, organic volatiles and $H_2O$ from the layer.

In accordance with the invention, the reactor should be of the type which creates an electric field in the SOG during operation thereof.

A reactor which has been found to produce the above effects is a parallel plate plasma reactor, such as type AM-3300, manufactured by Applied Materials Inc.

Another embodiment of the invention is a method for producing insulating layers over a substrate comprising spinning a film of spin-on-glass SOG over the substrate, precuring the film of SOG at an elevated temperature sufficient to remove the bulk of solvent, repeating the steps of spinning and precuring to form an SOG film having a predetermined total film thickness and curing the layer of SOG in a plasma in a plasma reactor of a type which creates an electric field in the SOG during operation thereof for a period of time sufficient to exclude the bulk of SiOH, organic volatiles and $H_2O$ from the layer.

Still another embodiment of the invention is a method of producing an integrated circuit, the steps of spinning a film of spin-on-glass (SOG) over a surface of a wafer to be planarized, precuring the film of SOG at an elevated temperature sufficient to remove the bulk of solvent, curing the film of SOG in a plasma in a plasma reactor of a type which creates an electric field in the SOG during operation thereof for a period of time sufficient to exclude the bulk of SiOH, organic volatiles and $H_2O$ from the layer, applying a layer of and defining photoresist on the surface of the SOG, etching or otherwise treating the integrated circuit through the defined photoresist, dry stripping the photoresist in an $O_2$ plasma, and applying a layer of metal conductor to the surface of the SOG over which the photoresist was stripped.

Still another embodiment of the invention is a method of producing an integrated circuit, the steps of spinning a film of spin-on-glass (SOG) directly over a surface of conductive material to be insulated, precuring the film of SOG at an elevated temperature sufficient to exclude the bulk of solvent, curing the film of SOG in a plasma in a plasma reactor of a type which creates an electric field in the SOG during operation thereof for a period of time sufficient to exclude the bulk of SiOH, organic volatiles and $H_2O$ from the layer and applying a conductive layer directly to the surface of the cured SOG layer. The conductive layer applied can be a metal conductor, and the further process steps can be utilized which are applying photoresist to the surface of the metal conductor, defining the photoresist by exposing it to light through a mask, washing away the photoresist over undesired regions, etching exposed metal conductor, removing the remaining photoresist, cleaning the surface of the circuit, and applying an insulating layer overtop of the circuit in direct contact with the SOG layer.

Still another embodiment of the invention is a method of producing an integrated circuit, the steps of spinning a film of spin-on-glass (SOG) directly over a surface of lower conductor material to be insulated, precuring the film of SOG at an elevated temperature sufficient to remove the bulk of the solvent, curing the film of SOG at between 200° C. and 400° C. in a plasma in a plasma reactor of a type which creates an electric field in the SOG during operation thereof for a period of time sufficient to exclude the bulk of SiOH, organic volatiles and $H_2O$ from the layer, applying a layer of photoresist to the surface of the cured SOG layer, defining the photoresist by exposing its surface to light through a mask, washing away the photoresist over regions for locating conductors, depositing a layer of upper conductor material over the photoresist and exposed SOG layer, removing the remaining photoresist and overlying metal layer, whereupon the conductors are formed, whereby the cured SOG layer forms a dielectric between lower conductor material and the upper conductor material. Then the further step can be undertaken of cleaning the surface, and depositing an insulating layer adherent to and over the exposed SOG surface and the conductors.

Another embodiment of the invention is a semiconductor integrated circuit having a layer of spin-on-glass thereover which is substantially devoid of SiOH, organic volatiles and $H_2O$ and a metal conductive layer for the circuit in direct contact with the SOG layer. In further embodiments the layer of spin-on-glass is a passivation film, a planarization film, or a buffer film.

In accordance with a further embodiment the invention is a liquid crystal, electrochromic or electroluminescent display having a front surface protectively covered by a layer of spin-on-glass which is substantially devoid of SiOH, organic volatiles and $H_2O$. The cured SOG layer protects the display from contamination by dissolution of alkali metal.

In accordance with a further embodiment, the plasma cured SOG devoid of SiOH, organic volatiles and $H_2O$ is an antireflective coating on a transparent medium. Another embodiment of the invention is a corrosion or chemical protective coating for an object comprised of the plasma cured spin-on-glass layer devoid of SiOH, organic volatiles and $H_2O$.

EXAMPLE 1

P-5 phosphorus doped silicate SOG purchased from Allied Chemical Corp. was coated using multiple coats to obtain a total thickness of about 500 nanometers on silicon semiconductor wafers. The SOG film was precured at 125° C. for 60 seconds in moist air at 40% relative humidity, and then at 200° C. for 60 seconds in moist air at 40° relative humidity on a hotplate, to remove the bulk of the solvent containing the SOG from the films, between each coat.

After the testing of the final coat, and its proper precure the wafers were cured at 400° C. in an oxygen plasma in the AM-3300 parallel plate plasma reactor for 60 minutes at 0.25 Torr, operated at 650 watts and 115 kHz.

The parallel plate plasma reactor generated an electric field adjacent to and within the SOG. After treatment the wafers were placed in contact with moist ambient air, and infrared spectra were recorded.

It was determined that the water content as well as the organics and SiOH content was substantially reduced, and was substantially smaller than a control set of nitrogen thermally treated films at 400° C. to 450° C. and not subjected to plasma treatment.

In the case of this oxygen plasma treatment, in place of SiOH bonds, SiH bonds were detected. (This SiH bond formation is not seen in case of non-oxidating plasma treatments).

It was also found that the treatment resulted in a thickness shrink of the films by about 15% (as was reported by Butherus and Schiltz) but in contrast to Butherus and Schiltz, the starting spin-on-glass, P-5, was of inorganic type and oxydation of the methyl bonds Si—$CH_3$ could not explain the shrink.

It was concluded that the plasma treatment in accordance with the present invention was very effective for the tight bonding, the removal of SiOH, organic volatiles and $H_2O$, in contrast to the process described by Butherus and Schiltz, which shows substantial remanence of SiOH and $H_2O$.

The treated films were put into contact with deionized water for a period of one hour after plasma treatment. The oxygen plasma treated SOG yielded SOG films which were much more stable than the control nitrogen thermally cured films, which process could not passivate the SOG films against water. However it was found that in the oxygen plasma treated film some of the SiH bonds were consumed to yield some SiOH and $H_2O$. Therefore the oxygen plasma treatment, which provided films containing little or no SiOH and $H_2O$ was observed not to provide a stable passivation against water, and thus is not a preferred plasma gas.

EXAMPLE 2

Silicon wafers were coated with 600 to 675 nanometers thickness of 106 methyl siloxane SOG (organic SOG) purchased from Allied Chemical Corp. The wafers were precured at 125° C. for 60 seconds in moist air and 40% relative humidity and then at 200° C. for 60 seconds in moist air at 40% relative humidity on a hotplate, in order to remove the bulk of solvents carrying the SOG.

The wafers were cured at 400° C. in a nitrogen plasma in a parallel plate reactor, which caused a self-biasing effect by producing a field adjacent the SOG in the RF discharge and thus an electric field within the SOG, for 60 minutes at 0.25 Torr operating at 650 watts and 115 kHz.

It was found that the water content in the SOG was nil. Carbon in the form of Si-$CH_3$ was detected. It was also determined that the nitrogen plasma treated films were just slightly denser than thermally cured control wafers.

The films on the wafers were placed into contact with boiling deionized water for 1 hour. Another infrared spectrum was taken.

Absolutely no water was detected. Absolutely no SiOH was detected. Undesirable SiH bonds were not produced, although they were produced in the oxygen plasma treatment. The film appeared to be literally uneffected by the 1 hour contact with boiling deionized water (which is nearly the effective equivalent of 5 days contact at 40% relative humidity at 21° C.).

The plasma cure in a nitrogen plasma appeared to be virtually ideal.

EXAMPLE 3

Very thick (>1.2 micron in thickness) 106 methyl siloxane SOG obtained from Allied Chemical Corp. was coated using multiple coats as a film on silicon wafers. Such thickness is more than sufficient for intermetal dielectric.

The films were precured at 125° C. for 60 seconds in moist air at 40% relative humidity and then at 200° C. for 60 seconds in moist air at 40% relative humidity, on a hotplate. The precured film on the substrate was put into contact with boiling deionized water for 60 minutes to increase its content of water.

The film was then cured in a nitrogen plasma in a parallel plate plasma reactor as described. in the previous examples, but for only 30 minutes at 400° C., operating at 650 watts and 115 kHz.

It was found that water absorbed by contact with deionized water after the precure step and prior to the plasma cure step was reversed during the plasma cure. The water did not appear after cure.

The nitrogen plasma cure passivated the SOG film and following the plasma cure and resulting passivation, almost no additional water absorption occurred after subsequent contact with moist air and/or boiling water. This is in contrast with the reported results on SOG thermal cures.

Photoresist dry strip was shown to have almost no effect on SOG film. This is contrast with reported results on thermal cures of this organic SOG.

It was determined that very thick SOG films can be coated without cracking and peeling during curing and contrast with reported results on SOG thermal cures. The $N_2$ cure resulted in no water content in the SOG film.

Essential steps of the last example thus can be used in a non-etch back, highly flexible, high quality SOG technology, in which the SOG could be used as a dielectric by itself, in contact with a semiconductor surface, in contact with vias or other metal conductors, as an insulator between two metal layers, without poisoning effect, and with good adherence to its underlying and overlying layers. Of course it can also be used in combination with another dielectric. The etch back and sandwich techniques required in order to use SOG in accordance with the prior art need not be used to produce products when the steps of the present invention are used. Accordingly the present invention includes structures which contain an SOG layer which is devoid of SiOH, organic volatiles and $H_2O$, used as a dielectric, insulator, etc.

It should be noted that the SOG film may be applied in many coats to improve planarization. In this case, a first coat is spun on the substrate, which should be precured; a second coat is spun on overtop of the underlying precured coat, which is precured; a third coat is spun on overtop of the underlying precured coat, which is precured; etc, after which the entire precured multicoated layer is cured in the plasma as described earlier.

The types of film that can be plasma cured are not restricted to silicon oxide types of SOGs. For example, types of spin-on coatings based on spin-on boron oxide, phosphorus oxide, arsenic oxide, aluminum oxide, zinc oxide, gold oxide, platinum oxide, antimony oxide, indium oxide, tantalum oxide, cesium oxide, iron oxide, or any combination thereof can be cured using the present invention.

In addition, spin-on coating types of materials formed of nitrides and oxinitrides of boron, phosphorus, arsenic, aluminum, zinc, gold, platinum, antimony, indium, tantalum, cesium and iron could be similarly cured and used.

The spin-on-glass can be either silicates undoped or doped with any of known, phosphorus, arsenic, aluminum, zinc, gold, platinum, antimony, indium, tantalum, cesium and iron or methyl siloxanes undoped or doped with the above elements, ethyl siloxanes undoped or doped with the above elements, butyl siloxanes undoped or doped with the above elements, phenyl siloxanes undoped or doped with the above elements, or combinations of any of the above-noted siloxanes.

Films plasma cured in accordance with this invention need not be restricted to interlayer dielectrics. Some applications and structures thereof are as a diffusion source for doping of substrates, as a passivation film, as a planarization film, as a buffer film, as a preventive film for dissolution of alkali metals (e.g. for displays such as liquid crystal, electrochromic or electroluminescent compounds), as an antireflective coating and other substances used for selective photon absorption, increased chemical resistance, friction reduction, corrosion protection, increased adhesion, etc.

For various applications, optimization of the process can include varying the distance between the plasma glow and the film to be treated, the application of an external polarization field (which can be either DC or AC) to the substrate or substrate holder to enhance the process by increasing the internal electric fields in the SOG film, variation of pressure, power, frequency, gas, gas mixture, mass flow, film temperature and time of treatment, etc.

The films produced by the process described herein can be used on or as part of integrated circuits, emission diode devices, liquid crystal, electrochromic and electroluminescent displays, photodetectors, solar batteries, etc. It can be applied to optical filters, antireflectors, as a passivation film on objects to be protected, as a corrosion protection layer, as an adhesion promoter, as a friction reducer, in mechanical field applications, etc.

I claim:

1. A method of producing an insulating layer over a semiconductor substrate comprising:
    (a) spinning a film of spin-on-glass (SOG) over a semiconductor substrate,
    (b) precuring the film of SOG at an elevated temperature sufficient to remove the bulk of solvent,
    (c) creating an electric field in the film of SOG at between 200° C. and 400° C. while curing the film of SOG in a plasma in a plasma reactor of a type exhibiting a self-biased RF discharge adjacent the SOG for a period of time sufficient to exclude the bulk of SiOH, organic volatiles and $H_2O$ from the film, and
    (d) while curing in the plasma, applying an external polarization field to the substrate to increase the internal electrical field in the SOG.

2. A method as defined in claim 1 in which the reactor is a parallel plate plasma reactor.

3. A method as defined in claim 1 in which the plasma is a non-oxidizing plasma.

4. A method as defined in claim 1 in which the plasma is a nitrogen plasma.

5. A method of producing an insulating layer over a semiconductor substrate comprising:
    (a) spinning a film of spin-on-glass (SOG) over a semiconductor substrate,
    (b) precuring the film of SOG at an elevated temperature sufficient to remove the bulk of solvent,
    (c) creating an electric field in the film of SOG while curing the film of SOG in a plasma in a plasma reactor of a type exhibiting a self-biased RF discharge adjacent the SOG, using an RF field in the plasma at about 115 KHz, a power density of about 0.2 watt/$cm^2$, a pressure of about 0.25 Torr, a mass flow rate of 750 SCCM, a current density of about 0.4 ma/$cm^2$ through the cathode of the reactor, and a curing period of between about 30 to 60 minutes whereby the substrate reaches a temperature of about 400° C.,
    whereby the bulk of SiOH, organic volatiles and $H_2O$ is excluded from the film.

6. A method as defined in claim 2 in which the SOG is of a type selected from the group consisting of silicon dioxide, boron oxide, phosphorous oxide, arsenic oxide, aluminum oxide, zinc oxide, gold oxide, platinum oxide, antimony oxide, indium oxide, tantalum oxide, cesium oxide and iron oxide, or any combination thereof.

7. A method as defined in claim 2 in which the SOG is of a type selected from the group consisting of the oxides, nitrides or oxynitrides of boron, phosphorous, arsenic, aluminum, zinc, gold, platinum, antimony, indium, tantalum, cesium, and iron or any combination thereof.

8. A method as defined in claim 2 in which the SOG is a silicon oxide type obtained from one of an organic SOG solution and an inorganic (siloxane) SOG solution.

9. A method for producing insulating layers over a substrate comprising:
   (a) spinning a film of spin-on-glass SOG over the substrate,
   (b) precuring the film of SOG at an elevated temperature sufficient to remove the bulk of solvent,
   (c) repeating steps (a) and (b) to form an SOG film having a predetermined total film thickness,
   (d) curing the film of SOG at between 200° C. and 400° C. in a plasma in a plasma reactor of a type which creates an electric field in the SOG during operation thereof for period of time sufficient to exclude the bulk of SiOH, organic volatiles and $H_2O$ from the film, and
   (e) while curing in the plasma, applying an external polarization field to the SOG and the substrate to increase the internal electrical field thereof.

10. A method as defined in claim 9 in which the reactor is a parallel plate plasma reactor.

11. A method as defined in claim 10 including the step of allowing contact of the surface of the SOG film with moisture or water prior to curing.

12. A method as defined in claims 2, 3 or 9 in which the SOG is selected from the group consisting of a doped or undoped silicate, and a doped or undoped methyl, ethyl, butyl and phenyl siloxane, the dopant being selected from the group consisting of born, phosphorus, arsenic, aluminum, zinc, gold, platinum, antimony, indium, tantalum, cesium and iron.

13. A method as defined in claim 2, 5 or 9 in which the SOG is a silicate or siloxane material doped with phosphorus.

14. In a method of producing an integrated circuit, the steps of
   (a) spinning a film of spin-on-glass (SOG) over a surface of a substrate to be planarized,
   (b) precuring the film of SOG at an elevated temperature sufficient to remove the bulk of solvent,
   (c) curing the film of SOG at between 200° C. and 400° C. in a plasma in a plasma reactor of a type which creates an electric field in the SOG during operation thereof for a period of time sufficient to exclude the bulk of SiOH, organic volatiles and $H_2O$ from the film, while applying an external polarization field to the substrate to increase the internal electric field in the SOG, and
   (d) applying a conductive layer to the surface of the integrated circuit such that it makes direct contact with the curved layer of SOG.

15. A method as defined in claim 12 in which the reactor is a parallel plate plasma reactor.

16. A method as defined in claim 15 in which the SOG is of a type selected from the group consisting of silicon dioxide, boron oxide, phosphorus oxide, arsenic oxide, aluminum oxide, zinc oxide, gold oxide, platinum oxide, antimony oxide, indium oxide, tantalum oxide, cesium oxide and iron oxide, or any combination thereof.

17. A method as defined in claim 15 in which the SOG is of a type selected from the group consisting of the oxides, nitrides or oxynitrides of boron, phosphorus, arsenic, aluminum, zinc, gold, platinum, antimony, indium, tantalum, cesium, and iron, or any combination thereof.

18. In a method of producing an integrated circuit, the steps of
   (a) spinning a film of spin-on-glass (SOG) over a surface of a subtrate to be planarized,
   (b) precuring the film of SOG at an elevated temperature sufficient to remove the bulk of solvent,
   (c) curing the film of SOG at between 200° C. and 400° C. in a plasma in a plasma reactor of a type which creates an electric field in the SOG during operation thereof for a period of time sufficient to exclude the bulk of SiOH, organic volatiles and $H_2O$ from the film, while applying an external polarization field to the substrate to increase the internal electric field in the SOG.
   (d) applying a layer of and defining photoresist on the surface of the SOG,
   (e) etching or otherwise treating the integrated circuit through the defined photoresist,
   (f) dry stripping the photoresist in an $O_2$ plasma, and
   (g) applying a layer of metal conductor to the surface of the SOG over which the photoresist was stripped.

19. In a method as defined in claim 18, the additional step, following the curing step and prior to applying a layer of photoresist, of depositing a layer of dielectric over the cured film of SOG.

20. In a method of producing an integrated circuit, the steps of
   (a) spinning a film of spin-on-glass (SOG) directly over a substrate surface of conductive material to be insulated,
   (b) precuring the film of SOG at an elevated temperature sufficient to exclude the bulk of solvent,
   (c) curing the film of SOG at between 200° C. and 400° C. in a plasma in a plasma reactor of a type which creates an electric field in the SOG during operation thereof for a period of time sufficient to exclude the bulk of SiOH, organic volatiles and $H_2O$ from the film, while applying an external polarization field to the substrate to increase the internal electric field in SOG,
   (d) applying a conductive layer directly to the surface of the cured SOG layer.

21. A method as defined in claim 20 in which the reactor is a parallel plate plasma reactor.

22. A method as defined in claim 21 in which the SOG is a silicon oxide type.

23. A method as defined in claim 20, 21, or 22, in which the conductive layer applied in step (d) is a metal conductor including the further steps of applying photoresist to the surface of the metal conductor, defining the photoresist by exposing it to light through a mask, washing away the photoresist over undesired regions, etching exposed metal conductor, removing the remaining photoresist, cleaning the surface of the circuit, and applying an insulating layer overtop of the circuit in direct contact with the SOG layer.

24. In a method of producing an integrated circuit, the steps of
   (a) spinning a film of spin-on-glass (SOG) directly over a substrate surface of lower conductor material to be insulated, (b) precuring the film of SOG at an elevated temperature sufficient to remove the bulk of the solvent, (c) curing the film of SOG at between 200° C. and 400° C. in a plasma in a plasma reactor of a type which creates an electric field in the SOG during operation thereof for a period of time sufficient to exclude the bulk of SioH, organic volatiles and $H_2O$ from the film, while applying an external electric field to the substrate to increase the internal electric field in the SOG, (d) applying a layer of photoresist to the surface of the cured SOG film, (e) defining the photoresist by exposing its surface to light through a mask, and washing away the photoresist over regions for locating conductors, (f) depositing a layer of upper conductor material over the photoresist and exposed SOG film, (g) removing the remaining photoresist and overlying metal layer, whereupon said conductors are formed, whereby the cured SOG film forms a dielectric between the lower conductor material and the upper conductor material.

25. A method as defined in claim 24, including the further step of cleaning said surface, then depositing an insulating layer adherent to and over the exposed SOG surface and the conductors.

26. A method as defined in claim 15 in which the gas used in the plasma reactor is a non-oxidizing gas.

27. A method as defined in claim 15 in which the gas used is the plasma reactor is nitrogen.

* * * * *